(12) United States Patent
Matsushita et al.

(10) Patent No.: US 7,354,852 B2
(45) Date of Patent: Apr. 8, 2008

(54) METHOD OF FORMING INTERCONNECTION IN SEMICONDUCTOR DEVICE

(75) Inventors: Kiyohiro Matsushita, Tama (JP); Naoki Ohara, Tama (JP); Nathan R. C. Kemeling, Tama (JP)

(73) Assignee: ASM Japan K.K., Tokyo (JP)

( * ) Notice: Subject to any disclaimer, the term of this patent is extended or adjusted under 35 U.S.C. 154(b) by 22 days.

(21) Appl. No.: 11/292,820

(22) Filed: Dec. 2, 2005

(65) Prior Publication Data

US 2006/0160352 A1 Jul. 20, 2006

Related U.S. Application Data

(60) Provisional application No. 60/635,097, filed on Dec. 9, 2004.

(51) Int. Cl.
*H01L 21/4763* (2006.01)

(52) U.S. Cl. .................. 438/622; 438/620; 438/624; 438/637; 438/672

(58) Field of Classification Search ........ 438/618–624, 438/637–638, 672–673, 700
See application file for complete search history.

(56) References Cited

U.S. PATENT DOCUMENTS

| | | | | |
|---|---|---|---|---|
| 6,348,407 | B1* | 2/2002 | Gupta et al. | 438/637 |
| 6,613,665 | B1* | 9/2003 | Catabay et al. | 438/636 |
| 6,759,321 | B2* | 7/2004 | Babich et al. | 438/622 |

* cited by examiner

*Primary Examiner*—Dung A. Le
(74) *Attorney, Agent, or Firm*—Knobbe, Martens, Olson & Bear LLP (57) ABSTRACT

A multilayer interconnection structure is formed by a method comprising the steps of: Forming a low dielectric constant film on a substrate, curing the low dielectric constant film by irradiating it with UV light, laminating a UV blocking film, laminating a next low dielectric constant film, and curing the next low dielectric constant film by irradiating it with UV light.

19 Claims, 9 Drawing Sheets

UV radiation

METHOD OF FORMING INTERCONNECTION IN SEMICONDUCTOR DEVICE

This Application is a Non-Divisional of 60/635,097 filed Dec. 9, 2004.

BACKGROUND OF THE INVENTION

The present invention generally relates to a method of forming an interconnection in a semiconductor device; and more particularly to a method of forming an interconnection by Single Damascene and/or Dual Damascene.

As wiring designs continue to shrink in size, wiring structures become multilayered, and semiconductor devices become highly integrated, it is indispensable to lower interlayer capacitance so as to highly improve speed of a device and to reduce power consumption. In order to lower the interlayer capacitance, low-k materials (low dielectric constant films) are used. The low-k materials, however, have a very low elastic modulus (EM) of approximately 4-6 GPa in the vicinity of a dielectric constant (k) of 2.5 as compared with conventional TEOS-SiO2 having an elastic modulus of 70-80 GPa; hence, it is difficult for the low-k materials to withstand stress that they receive during subsequent processing such as CMP, wiring bonding and packaging.

SUMMARY OF THE INVENTION

As one of the methods for improving the above-mentioned problem, a method of improving an elastic modulus (EM) of a low-k material by curing the material by UV irradiation can be considered (For example, U.S Pat. No. 6,759,098; U.S. Pat. No. 6,296,909). The low-k materials, however, shrink and harden by UV irradiation; by this technique, it is possible to improve their elastic modulus (EM) by 50-200%. If this technique, however, is applied to a laminated structure for multilayer interconnection, not only a target low-k film but also an underlying low-k film is cured because each layer of low-k films is irradiated with UV light each time. The more the number of lamination layers increases, the more the number of times an underlying low-k film receiving UV irradiation increases and the greater the impact of UV irradiation becomes. If an underlying low-k film is cured more than necessary, its film thickness and stress change excessively and separation occurs in a bonding surface of Cu wiring buried in a low-k material and the low-k material. Additionally, because a dielectric constant of a low-k film also changes by UV curing by approximately +/−10%, a rate of change may also increase if the number of curing times increases. An amount of shrinkage and an amount of hardening are affected by an irradiation time, irradiation intensity, a substrate temperature and a type of gas in an irradiation atmosphere, and it is difficult to solve the above-mentioned problem by irradiation conditions.

According to one embodiment of the present invention, the above-mentioned problem is solved by selecting a UV blocking film, which absorbs UV light used for UV curing and suppresses the impact of the UV curing on an underlying layer, and by forming the film between each layer of low-k films. As a UV blocking film, a film having a greater extinction coefficient at UV wavelengths used, and a high rate of UV absorption is preferable. By forming a UV blocking film, excessive curing of an underlying low-k film can be prevented and the integrity of the laminated structure can be preserved. In another embodiment of the present invention, by applying UV curing when a laminated structure is formed by Single Damascene and/or Dual Damascene and using a UV blocking film, an elastic modulus (EM), etc. of a low-k film are effectively improved. Additionally, in still another embodiment, a UV blocking film and an etch stop film are formed separately; in an embodiment, a single film is used both as a UV blocking film and an etch stop film. When UV light having wavelengths of 200 nm or less is used, using a film having high selectively of UV absorption such as SiC, SiCN, SiCO and SiN as an etch stopper between each layer of low-k films, an impact of UV irradiation on an underlying layer can be suppressed without using a UV blocking film separately.

The present invention is not limited to the above-mentioned embodiments, but is widely applicable as a technique for forming an interconnection.

The present invention includes at least embodiments described below. In other words, one embodiment of the present invention provides a method of forming a multilayer interconnection structure comprising the steps of: (1) forming a low-k film on a substrate, (2) irradiating the low-k film with UV light, thereby curing it, (3) laminating a UV blocking film, (4) laminating a next low-k film, and (5) irradiating the next low-k film with UV light, thereby curing it.

Additionally, another embodiment of the present invention provides a method of forming a multilayer interconnection structure comprising the steps of: (1) selecting UV light for curing a low-k film, (2) selecting a material absorbing wavelengths of the UV light, (3) forming a low-k film on a substrate, (4) irradiating the low-k film with the UV light selected, thereby curing it, (5) laminating a UV blocking film using the material absorbing wavelengths of the selected UV light, (6) laminating a next low-k film, and (7) irradiating the next low-k film with the UV light, thereby curing it.

Furthermore, still another embodiment of the present invention provides a method of forming a multilayer interconnection structure comprising the steps of: (1) forming a first low-k film having a first film thickness on a substrate, (2) irradiating the first low-k film with UV light, thereby curing it to change it to a hardened first low-k film having a second film thickness, (3) laminating a UV blocking film, (4) laminating a second low-k film having a first film thickness, (5) irradiating the second low-k film with UV light, thereby curing it to change it a hardened second low-k film having a second film thickness and at the same time curing the hardened first low-k film to change its thickness to a third thickness, wherein a rate of change of the first low-k film from the second thickness to the third film thickness is approximately 30% or less (25%, 20%, 15%, 10%, 5%, and ranges between any two numbers of the foregoing; preferably approximately 20% or less) of a rate of change from the first film thickness to the second film thickness.

By performing the above-mentioned steps repeatedly, a laminated structure having two layers or more can be formed. Additionally, a rate of change of a film thickness for the third time and on goes further lower than the above-mentioned rate of change. The above-mentioned embodiments further include at least various aspects described below; and any element used in each embodiment can interchangeably be used in another embodiment.

DETAILED DESCRIPTION OF THE PREFERRED EMBODIMENT

As described above, in one embodiment of the present invention, UV irradiation is performed when an interconnection is formed using a low-k film. Because the low-k film is cured by UV irradiation which has an impact on an underlying low-k film, a blocking film is used in order to prevent the impact of the UV irradiation on the underlying low-k film. In other words, in order to facilitate integration in a technique for reforming a film property by UV irradiation, it is necessary to prevent the impact on an underlying film. In one embodiment of the present invention, by introducing a UV block film, or giving an etch stopper a function of blocking UV light, both functions can be accomplished by a single film.

The present invention includes the following embodiments, but is not limited to those. Additionally, a requirement in an embodiment can be interchanged with another requirement in another embodiment.

Film Formation and Film Formation Apparatus

The present invention can apply widely to an interconnection structure. In an embodiment, films formed comprise a low-k film, a UV blocking film, an etch-stopper film, or preferably comprise a single film having functions of both a UV blocking film and an etch-stopper film. As an electric conductor, copper is preferably used. Additionally, a hard mask, a photoresist, etc. are suitably used in a Damascene scheme. Additionally, in an embodiment, a passivation protective film is formed on a surface of the wiring layer formed on a substrate.

Low-k Film

As a representative low-k film, a Si-containing hydrocarbon compound (organic silane) can be mentioned, but a low-k film is not limited to it, any film which functions as a low-k film can be used without limitation.

Additionally, as a low-k film, for example, films disclosed in U.S. Pat. No. 6,348,407 and U.S. Pat. No. 6,818,570 can be mentioned (These U.S. Patents are incorporated herein by reference in their entirety.).

A low-k film, according to an embodiment, can be formed by a reaction gas supply unit and a plasma CVD reactor using a capacitively-coupled method. For example, an apparatus shown in a schematic view in FIG. 1 can be used. In other words, by placing a pair of electroconductive flat-plate electrodes (an upper electrode 1 and a lower electrode 2) in parallel within a reactor 3 and applying RF power 5 of, for example, approximately 27 MHz (A frequency is selected according to a type of source gas used.) to one side of the electrodes and grounding 8 the other electrode, plasma is excited between the electrodes. A substrate 4 is placed on the lower electrode 2. A temperature control mechanism is attached to the lower stage (lower electrode) 2 and a temperature is kept at a given constant temperature in the range of approximately 200° C. to approximately 600° C. In this state, a liquid organic monomer (e.g. DMDMOS (dimethyldimethoxylsilane), DEDEOS (diethyldimethoxyoxysilane), etc.) gasified by a gasifier 6 and an inert gas and other dry gas, etc. 7 are mixed properly and fed into a reactor. Gas within the reactor 3 is exhausted from an exhaust duct 9. Additionally, preferably piping through which a gas is introduced from the gasifier to the reactor and a showerhead unit disposed in an upper portion of the reactor are heated and temperature-controlled by a heater and the exterior is covered by an insulating material.

Figure 1:
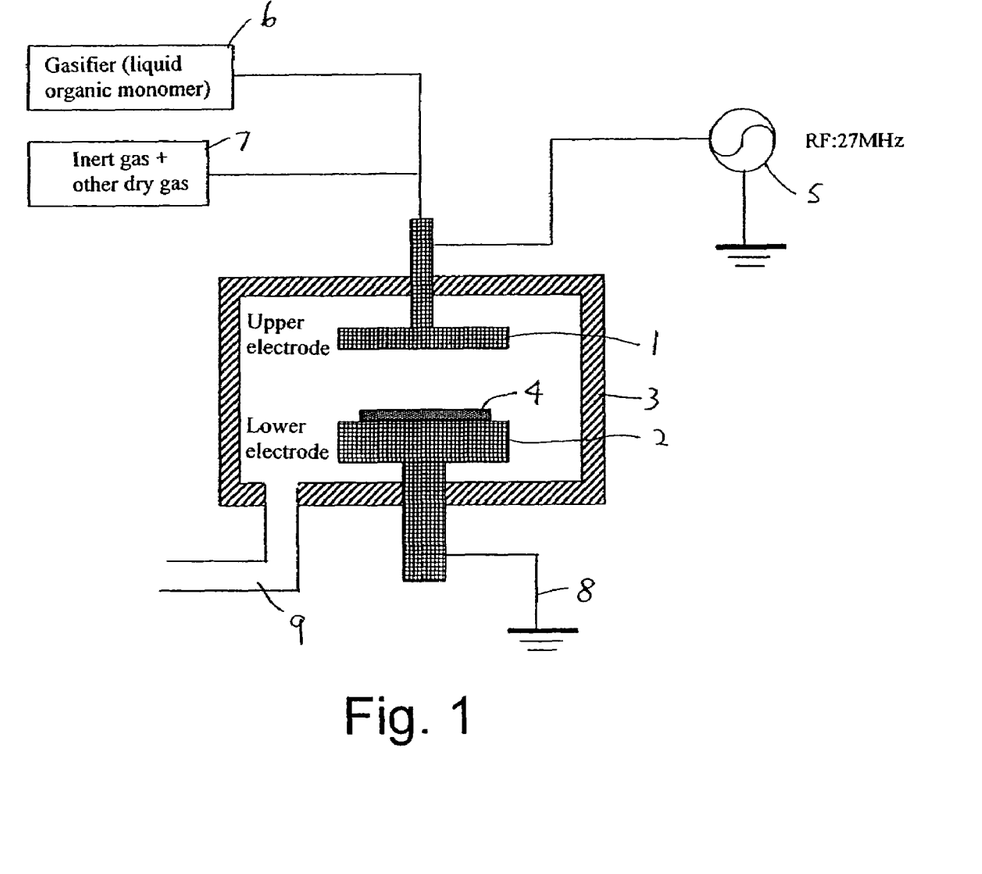
FIG. 1 is a schematic view showing one example of a low-k film formation apparatus comprising a vaporizer and a plasma CVD reactor, which can be used in the present invention. This figure is excessively simplified for purposes of illustrating the invention; and the present invention is not limited to this figure.

A low-k film can be formed by a process other than the above-mentioned and a manufacturing apparatus is not limited to the one shown in FIG. 1. Additionally, a low-k film formed using organic silane generally has an elastic modulus (EM) of approximately 4-6 GPa in the vicinity of a dielectric constant (k) of 2.5, which is very low as compared with 70-80 GPa that a conventional TEOS-SiO2 film has; hence it is difficult to withstand stress received during a post-process such as CMP, wiring bonding and packaging. In an embodiment of the present invention, the above-mentioned low-k film improvement is achieved. Even if a low-k film has a better elastic modulus than the above-mentioned or a higher dielectric constant than the above-mentioned, the present invention can be intended to any low-k film as long as a low-k film can be cured by UV irradiation, and can further improve the low-k film.

Etch Stopper Film

According to a preferred embodiment of the present invention, although the present invention is not limited to this embodiment, a single film used as both an etch-stopper film and a UV blocking film is formed. This type of film can be selected using an extinction coefficient at a wavelength used in UV curing and selectivity to the low-k film as indicators. For example, an extinction coefficient of 0.2 or more (0.3, 0.4, 0.5, 0.6, 0.7, 0.8, 0.9, and ranges between any two numbers of the foregoing) at a wavelength used and selectivity to the low-k film of 5:1 to 20:1 (10:1, 15:1, and ranges between any two numbers of the foregoing) are used as indicators. Additionally, an IV characteristic value of 1E-8A/cm2 or less (in an embodiment, 1E-9A/cm2 or less) at 1 MV/cm can also be further selected as an indicator.

This type of film can comprise a material selected from a group consisting of, for example, SiC, SiCN, SiCO, and SiN, although the material is not limited to these (for example, those disclosed in U.S. patent application Ser. Nos. 10/616,163, 10/643,200, 10/682,180, 10/722,179, etc. can be used, although materials are not limited to those. These Patent Applications are incorporated herein by reference in their entirety).

Additionally, in an embodiment, a UV blocking and etch stopper film may be formed with a thickness enough to absorb approximately 50% or more (60%, 70%, 80%, 90%, virtually 100%, and ranges between any two numbers of the foregoing; preferably 90% or more) of UV light irradiated to the blocking and etch stopper film. For example, a thickness of a UV blocking and etch stopper film may be from approximately 10 nm to approximately 100 nm (20 nm, 30 nm, 40 nm, 50 nm, 60 nm, 70 nm, 80 nm, 90 nm, and ranges between any two numbers of the foregoing; preferably from approximately 20 nm to approximately 50 nm).

Additionally, in an embodiment, curing of a low-k film may be performed with UV wavelengths in a range of approximately 100 nm to approximately 400 nm (150 nm, 200 nm, 250 nm, 300 nm, 350 nm, and ranges between any two numbers of the foregoing; preferably approximately 200 nm), irradiation intensity in a range of approximately 1 mW/cm2 to approximately 1,000 mW/cm2 (10 mW/cm2, 50 mW/cm2, 100 mW/cm2, 200 mW/cm2, 500 mW/cm2, 800 mW/cm2, and ranges between any two numbers of the foregoing) and irradiation time in a range of approximately 5 sec. to approximately 300 sec. (10 sec., 20 sec., 50 sec., 100 sec., 200 sec., and ranges between any two numbers of the foregoing).

Film formation in the case of a SiC film will be explained below. Other films can also be formed in the same way.

Figure 2:
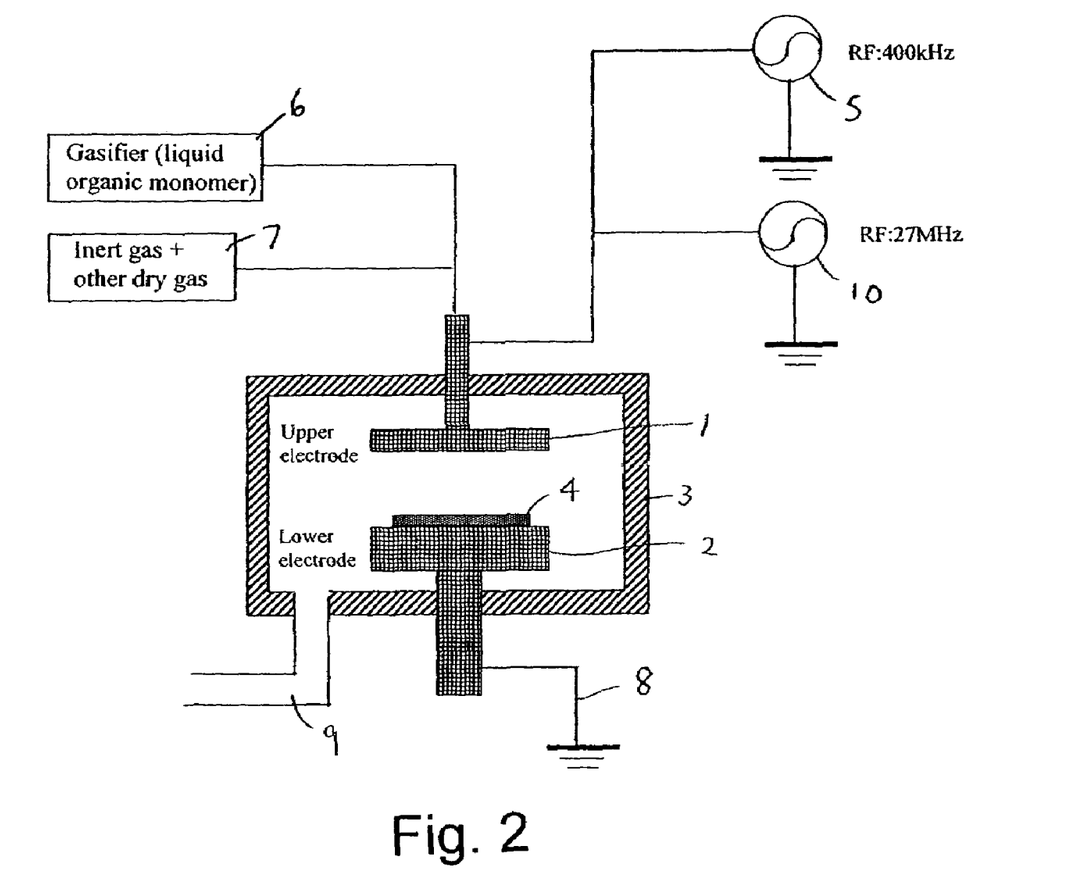
FIG. 2 is a schematic view showing one example of a SiC film formation apparatus comprising a vaporizer and a plasma CVD reactor, which can be used in the present invention. This figure is excessively simplified for purposes of illustrating the invention; and the present invention is not limited to this figure.

As an apparatus which can be used for the film formation, for example, a reaction gas supply unit and a plasma CVD reactor using a capacitively-coupled method shown in FIG. 2 can be mentioned, although the apparatus is not limited to this. By disposing a pair of electroconductive flat-plate electrodes (an upper electrode 1 and a lower electrode 2) in parallel within a reactor 3 and applying RF power 5, 10 of two different frequencies mixed, for example, 27 MHz and 400 kHz (A frequency is selected according to a targeted film.), to one side of the electrodes and grounding the other electrode, plasma is excited between the electrodes. A substrate 4 is placed on the lower electrode 2. A temperature control mechanism is attached to the lower stage (lower electrode) 2 and a temperature is kept at a given constant temperature in a range of approximately 200° C. to approximately 600° C. In this state, a liquid organic monomer (Si(CH3)4, etc.) gasified by a gasifier 6 and an inert gas and other dry gas, etc. 7 are mixed and fed into a reactor. Gas within the reactor 3 is exhausted from an exhaust duct 9. Additionally, preferably piping through which a gas is introduced from the gasifier to the reactor and a showerhead unit disposed in an upper part of the reactor are heated and temperature-controlled by a heater and the exterior is covered by an insulating material.

UV Irradiation Apparatus and Irradiation to the Film

Figure 3:
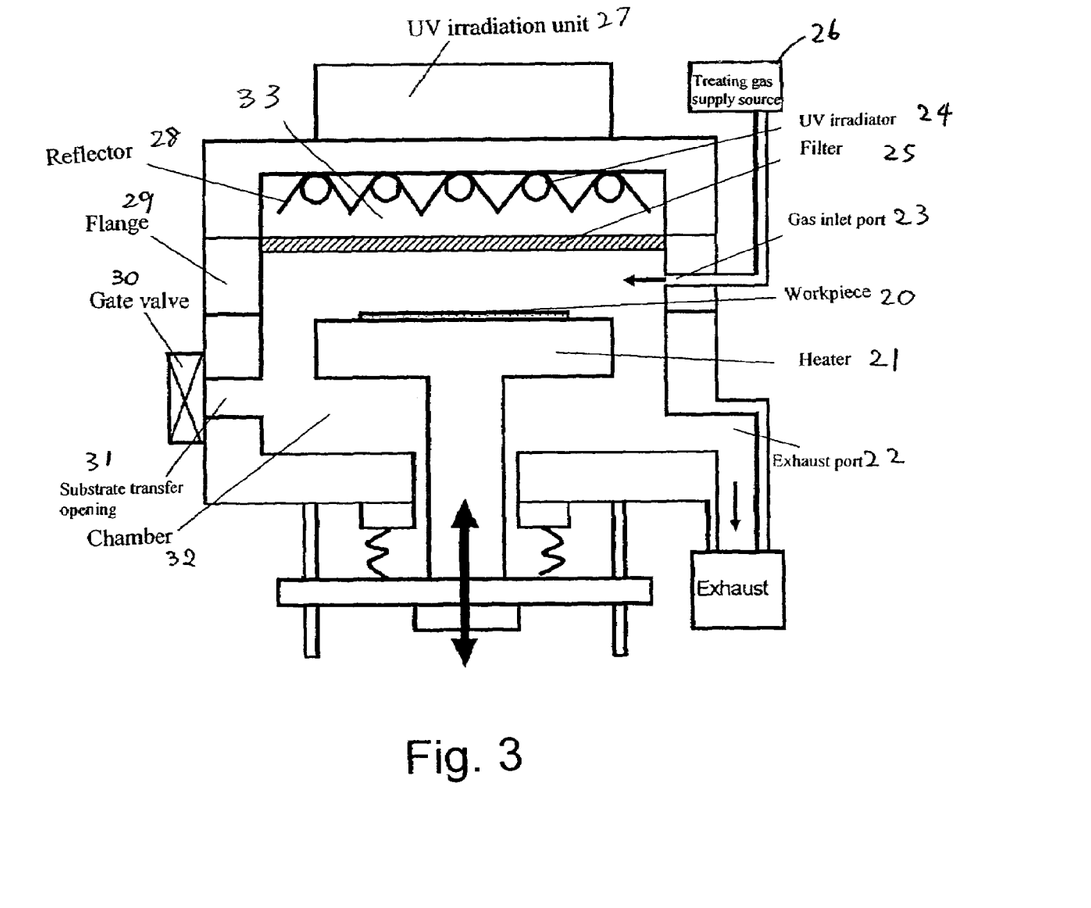
FIG. 3 is a schematic view showing one example of a UV irradiation apparatus, which can be used in the present invention. This figure is excessively simplified for purposes of illustrating the invention; and the present invention is not limited to this figure.

A UV irradiation apparatus will be explained below. An apparatus shown in FIG. 3 is one embodiment of a UV irradiation apparatus which can be used in the present invention. The apparatus is not limited to this as long as it can perform UV irradiation. This apparatus comprises a chamber 32, which can control an internal pressure from a vacuum to the vicinity of an atmospheric pressure and a UV irradiation unit 27 installed on the top of the chamber, and further comprises a UV irradiator 24 radiating continuous and pulse UV radiation, a heater 21 installed parallel to and facing the UV irradiator, and a filter 25 installed between the UV irradiator 24 and the heater 21 and parallel to and facing them. The filter 25 is used for achieving uniform UV irradiation, which is made of, for example, synthetic quartz and can isolate the reactor from the atmosphere and let UV transmit through it.

The UV irradiator 24 within the UV irradiation unit 27 is tubular and plural irradiators are disposed in parallel; as shown in FIG. 3, each irradiator is disposed properly for the purpose of uniformizing irradiation intensity, and a reflector 28 is provided so as to adequately reflect UV light from each UV irradiator on a thin film, and an angle of the reflector can be adjusted in order to uniformize UV intensity. In this apparatus, the chamber 32 which can control an internal pressure from a vacuum to the vicinity of an atmospheric pressure via a flange on which the filter is installed and the UV irradiators disposed within the chamber for radiating continuous or pulse UV radiation are separated, i.e., a substrate-processing portion and a UV-radiating portion 33 are separated. The UV irradiators have an easily removable/replaceable construction.

A gas is introduced through the flange 29; plural gas inlet ports 23 are provided with their positions symmetrically arranged so as to produce a uniform processing atmosphere. A UV irradiation process comprises the steps of: Making an atmosphere within the chamber 32 at a pressure of approximately 0.1 Torr to the vicinity of an atmospheric pressure (1 Torr, 10 Torr, 50 Torr, 100 Torr, 1,000 Torr, and ranges between any two numbers of the foregoing) by introducing a gas selected from Ar, CO, CO2, C2H4, CH4, H2, He, Kr, Ne, N2, O2, Xe, alcohol-containing gas and organic gas; placing a semiconductor substrate, which is a workpiece 20 introduced from a substrate transfer opening 31 through a gate valve 30, on the heater 21, whose temperature is set at approximately 0° C. to approximately 650° C. (10° C., 50° C., 100° C., 200° C., 300° C., 400° C., 500° C., 600° C., and ranges between any two numbers of the foregoing; preferably 300° to 450°); and irradiating a thin film on the semiconductor substrate from a proper distance (approximately 1 cm to approximately 100 cm) with UV light having wavelengths of approximately 100 nm to approximately 400 nm (150 nmnm, 200 nm, 250 nm, 300 nm, 350 nm, and ranges between any two numbers of the foregoing; preferably approximately 200 nm) radiated from the UV irradiators at UV output of approximately 1 mW/cm2 to approximately 1,000 mW/cm2 (10 mW/cm2, 50 mW/cm2, 100 mW/cm2, 200 mW/cm2, 500 mW/cm2, 800 mW/cm2, and ranges between any two numbers of the foregoing), and by continuous or pulse radiation at approximately 1 Hz to approximately 1,000 Hz (10 Hz, 100 Hz, 200 Hz, 500 Hz, and ranges between any two numbers of the foregoing). Irradiation time is approximately 1 sec. to approximately 20 min. (5 sec., 10 sec., 20 sec., 50 sec., 100 sec., 200 sec., 500 sec., 1,000 sec., and ranges between any two numbers of the foregoing). Gas inside the chamber 32 is exhausted from an exhaust port 22. This semiconductor-manufacturing apparatus performs this series of processing steps in an automatic sequence, which comprises the steps of: introducing gases, irradiating a thin film with UV light, stopping the irradiation and stopping gas supply.

The above-mentioned irradiation conditions are suitably adjusted according to a relation with a UV blocking film and with a low-k film. The longer irradiation time is, the more an amount of hardening increases; the higher irradiation intensity is, the higher a hardening rate goes up; and the higher a substrate temperature is, the higher a hardening rate goes up. Additionally, because a result may vary with respective cases when a hardening amount and a shrinkage rate are examined after the reactor is filled with Ar, He, N2, or other gas, a gas is selected accordingly.

Multilayer Interconnection and Formation of the Same

A multilayer interconnection structure can be built typically by a Single Damascene scheme or Dual Damascene, both of which are described below. The present invention, however, is not limited to these schemes.

Single Damascene Formation Method

A Single Damascene method can be performed by steps described below. The present invention, however, is not limited to these steps and can be performed, furthermore, by properly modifying these steps according to an intended structure.

Figure 4A:
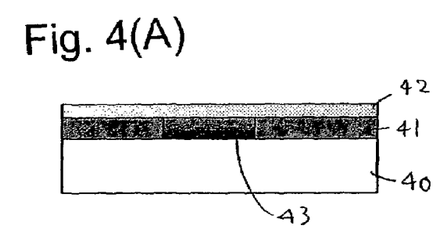
FIGS. 4A to 4H are schematic views showing the steps of a Single Damascene scheme in one embodiment of the present invention. These figures are excessively simplified for purposes of illustrating the invention; and the present invention is not limited to these figures.

1) An insulation film 41 is formed on a semiconductor substrate 40 and a passivation protective film 42 is formed on metal wiring 43 buried in the insulation film (FIG. 4A). As a passivation protective film, an independent film is not needed; for example, a passivation protective film is formed on a metal surface as soon as the metal surface is treated with an acid solution (e.g., nitric acid solution, etc.) and surface pollutants are removed. Additionally, as a passivation protective film, oxide deposition may be formed or an organic planarization layer may be spin coated.

Figure 4B:
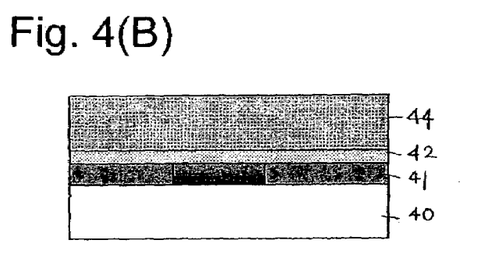

2) A first layer of low-k film 44 is formed on the passivation protective film 42 (FIG. 4B).

Figure 4C:
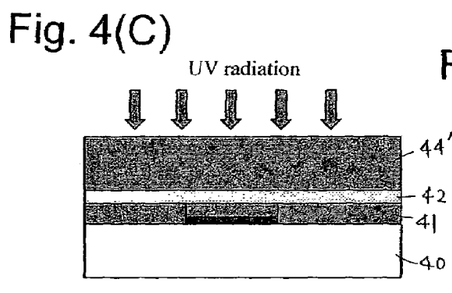

3) By irradiating the low-k film 44 with UV light from its upper side, the low-k film is reformed and becomes a reformed low-k film 44' (FIG. 4C).

4) After a hardmask layer 45 is formed on the top of the reformed low-k film 44', the hardmask layer 45 is patterned using photoresist; etching is performed on the hardmask layer 45 and the low-k film 44'; and the passivation protective film 42 is removed; a via opening portion for burying metal wiring is created.

5) A barrier metal layer is formed on the via opening portion.

6) A copper seed layer is formed on the barrier metal, and the via is copper-plated 46 by electroplating or non-electroplating.

Figure 4D:
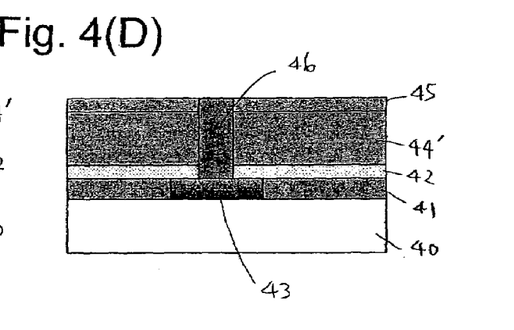

7) After the copper-plating, planarization is performed by CMP (FIG. 4D). The hardmask layer 45 is thinned by being scraped away by CMP.

Figure 4E:
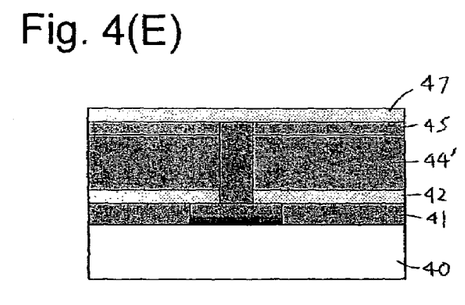

8) On the polished hardmask layer 45, either of SiC, SiCN, SiCO or SiN is formed as an etch stopper 47 (FIG. 4E).

Figure 4F:
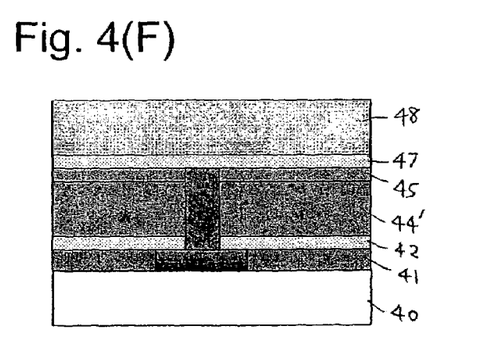

9) A second layer of low-k film 48 is formed on the etch-stopper film 47 (FIG. 4F).

Figure 4G:
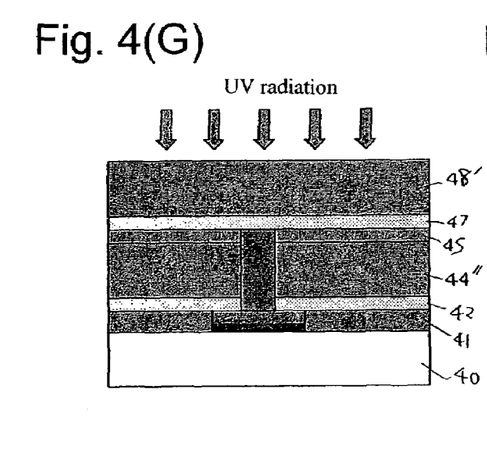

10) By irradiating the low-k film 48 with UV light from its upper side, the low-k film is reformed and becomes a reformed low-k film 48' (FIG. 4G). At this time, if the UV light is irradiated to the first layer of reformed low-k film 44', the first layer of the reformed low-k film 44' is further reformed and becomes a re-reformed low-k film 44".

11) After a hardmask layer 49 is formed on the top of the reformed low-k film 48', the hardmask layer 49 is patterned using photoresist; etching is performed on the hardmask layer 49 and the low-k film 48'. Subsequently, an opening is formed in the etch stopper 47 by reducing the impact on the low-k films by dry etching having a high selected ratio of the etch stopper to the reformed low-k film, and a trench opening portion for burying metal wiring is created.

12) A barrier metal layer is formed on the trench opening portion.

13) A copper seed layer is formed on the barrier metal layer, and the trench is copper-plated 401 by electroplating or non-electroplating.

Figure 4H:
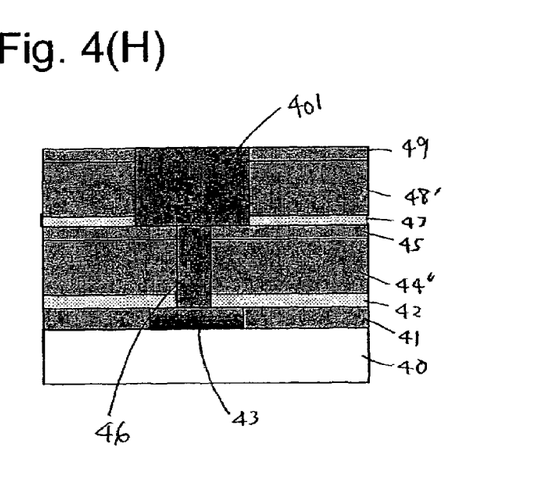

14) After the copper-plating, planarization is performed by CMP (FIG. 4H). The hardmask layer 49 is thinned by being scraped away by CMP.

In (4) above, the low-k film has a dielectric constant (k) of approximately 2.3 to approximately 3.0 (2.5, 2.7, 2.9, and ranges between any two numbers of the foregoing), an elastic modulus (EM) of approximately 4 Gpa to approximately 10 GPa (5 GPa, 6 GPa, 7 GPa, 8 GPa, 9 GPa, and ranges between any two numbers of the foregoing) and a film thickness of approximately 200 nm to approximately 1,000 nm (300 nm, 500 nm, 750 nm, and ranges between any two numbers of the foregoing) in an embodiment. Additionally, it is preferable that the etch stopper film 47 in (8) has an extinction coefficient and a film thickness enough to absorb 90% or more of UV light in an embodiment. Additionally, UV irradiation in (3) and (10) is performed to a thin film on a semiconductor substrate with UV light having a wavelength of approximately 100 nm to approximately 400 nm (150 nm, 200 nm, 250 nm, 300 nm, 350 nm, and ranges between any two numbers of the foregoing; preferably approximately 200 nm) at an output of approximately 1 mW/cm2 to approximately 1,000 mW/cm2 (10 mW/cm2, 50 mW/cm2, 100 mW/cm2, 200 mW/cm2, 500 mW/cm2, 800 mW/cm2, and ranges between any two numbers of the foregoing) by continuous or pulse radiation at approximately 1 Hz to approximately 1,000 Hz (10 Hz, 100 Hz, 200 Hz, 500 Hz, and ranges between any two numbers of the foregoing). Irradiation time is approximately 1 sec. to approximately 20 min. (5 sec., 10 sec., 20 sec., 50 sec., 100 sec., 200 sec., 500 sec., 1,000 sec., and ranges between any two numbers of the foregoing; preferably 10 sec to 300 sec).

Additionally, the hardmask layer in (4) above is formed using SiO2 or a high-density low-k film (for example, a film formed by reducing an amount of hydrogen atoms), which has a film thickness of approximately 30 nm to approximately 70 nm in an embodiment, and the film thickness is reduced to approximately 20 nm to approximately 40 nm by the CMP process in (7) above. SiO2 and high-density low-k film, however, do not have significant UV blocking capability and it is difficult to prevent hardening of an underlying low-k film by a remaining film from the CMP process. In another embodiment, however, a hardmask layer can be formed using SiC, SiN, and etc. In this case, a hardmask layer can be made to function as a UV blocking film. The hardmask layer in this case has a characteristic equivalent to that of an etch stopper. Additionally, in still another embodiment, both of an etch stopper and a hardmask layer can be made to act as a UV blocking film.

Dual Damascene Formation Method

An example of a Dual Damascene scheme is shown below, but the present invention is not limited to this.

Figure 5A:
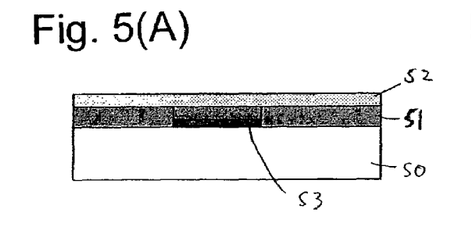
FIGS. 5A to 5H are schematic views showing the steps of a Dual Damascene scheme in one embodiment of the present invention. These figures are excessively simplified for purposes of illustrating the invention; and the present invention is not limited to these figures.

1) An insulation film 51 is formed on a semiconductor substrate 50 and a passivation protective film 52 is formed on metal wiring 53 buried in the insulation film (FIG. 5A).

Figure 5B:
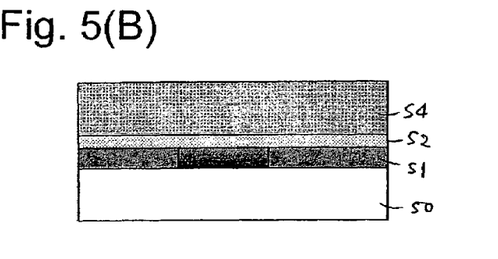

2) A first layer of low-k film 54 is formed on the passivation protective film 52 (FIG. 5B). Additionally, on a boundary between a via and a trench, a thin etch stopper (not shown) composed of SiO2, SiN, etc. is provided; this etch stopper does not have a significant UV blocking capability.

Figure 5C:
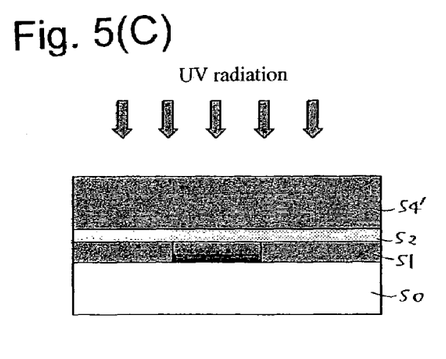

3) By irradiating the low-k film 54 with UV light from its upper side, the low-k film is reformed and a reformed low-k film 54' is formed (FIG. 5C).

4) After a hardmask layer 55 is formed on the top of the reformed low-k film 54', the hardmask layer 55 is patterned; etching is performed on the hardmask layer 55 and the low-k film 54'; and the passivation protective film 52 is removed; a via/trench opening portion for burying metal wiring is created. Additionally, if the via is formed prior to the trench, the via is formed and subsequently it is covered by photoresist (or SOG or an organic matter called slum); after that, etching of the trench is performed. If the trench is formed prior to the via, the trench is formed, and subsequently it is covered by photoresist (or SOG or an organic matter called slum); after that, etching of the via is performed.

5) A barrier metal layer is formed on the via/trench opening portion.

6) A copper seed layer is formed on the barrier metal, and the via/trench is copper-plated 56 by electroplating or non-electroplating.

Figure 5D:
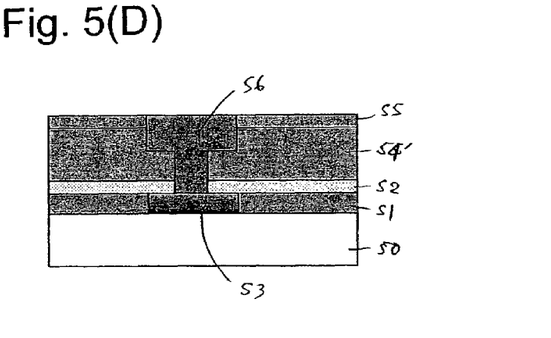

7) After the copper-plating, planarization is performed by CMP (FIG. 5D). The hardmask layer 55 is thinned by being scraped away by CMP.

Figure 5E:
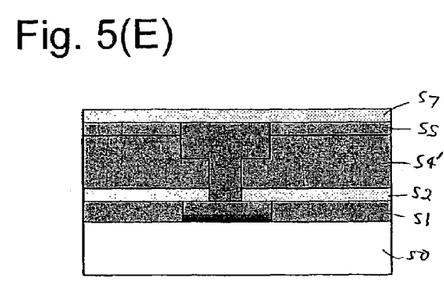

8) On the copper-plated layer, either of SiC, SiCN, SiCO or SiN is formed as an etch stopper 57 (FIG. 5E).

Figure 5F:
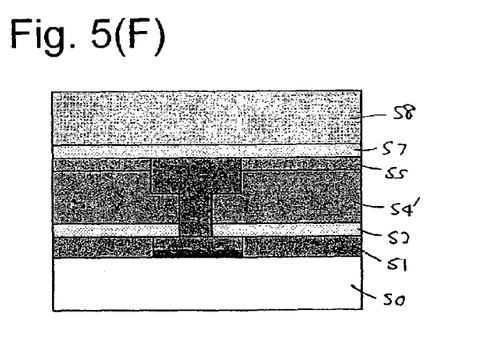

9) A second layer of low-k film 58 is formed on the etch-stopper film 57 (FIG. 5F).

Figure 5G:
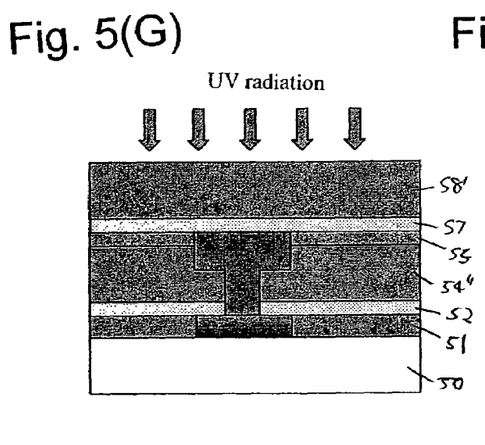

10) By irradiating the low-k film 58 with UV light from its upper side, the low-k film is reformed and becomes a low-k film 58' (FIG. 5G). At this time, if the UV light is irradiated to the first layer of reformed low-k film 54', the reformed low-k film 54' is further reformed and becomes a re-reformed low-k film 54".

11) After a hardmask layer 59 is formed on the top of the reformed low-k film 58', the hardmask layer 59 is patterned; etching is performed on the hardmask layer 59 and the low-k film 58' to create a via/trench opening portion for burying metal wiring. Here, in either case that the via is formed prior to the trench or the trench is formed prior to the via, after the via is formed, an opening is formed in the etch stopper by reducing the impact on the low-k films by dry etching having a high selected ratio of the etch stopper to the reformed low-k film.

12) A barrier metal layer is formed on the via/trench opening portion.

13) A copper seed layer is formed on the barrier metal layer, and the via/trench is copper-plated 501 by electroplating or non-electroplating.

Figure 5H:
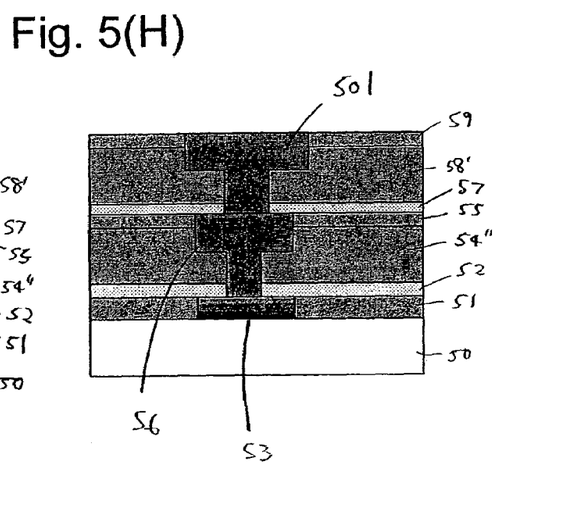

14) After the copper-plating, planarization is performed by CMP (FIG. 5H). The hardmask layer 59 is thinned by being scraped away by CMP.

In (4) above, a low-k film has a dielectric constant (k) of approximately 2.3 to approximately 3.0 (2.5, 2.7, 2.9, and ranges between any two numbers of the foregoing), an elastic modulus (EM) of approximately 4 Gpa to approximately 10 GPa (5 GPa, 6 GPa, 7 GPa, 8 GPa, 9 GPa, and ranges between any two numbers of the foregoing) and a film thickness of approximately 200 nm to approximately 1,000 nm (300 nm, 500 nm, 750 nm, and ranges between any two numbers of the foregoing) in an embodiment. Additionally, it is preferable that the etch stopper film in (8) has an extinction coefficient and a film thickness enough to absorb 50% or more of UV light in an embodiment. Additionally, UV irradiation in (3) and (10) is performed to a thin film on a semiconductor substrate with UV light having a wavelength of approximately 100 nm to approximately 400 nm (150 nm, 200 nm, 250 nm, 300 nm, 350 nm, and ranges between any two numbers of the foregoing; preferably approximately 200 nm) at an output of approximately 1 mW/cm2 to approximately 1,000 mW/cm2 (10 mW/cm2, 50 mW/cm2, 100 mW/cm2, 200 mW/cm2, 500 mW/cm2, 800 mW/cm2, and ranges between any two numbers of the foregoing) by continuous or pulse radiation at approximately 1 Hz to approximately 1,000 Hz (10 Hz, 100 Hz, 200 Hz, 500 Hz, and ranges between any two numbers of the foregoing). Irradiation time is approximately 1 sec. to approximately 20 min. (5 sec., 10 sec., 20 sec., 50 sec., 100 sec., 200 sec., 500 sec., 1,000 sec., and ranges between any two numbers of the foregoing; preferably 5 sec. to 300 sec.).

Additionally, similarly to the above-mentioned Single Damascene scheme, the hardmask layer in (4) above is formed using SiO2 or a high-density low-k film (for example, a film formed by reducing an amount of hydrogen atoms), which has a film thickness of approximately 30 nm to approximately 70 nm in an embodiment and the film thickness is reduced by the CMP process in (11) above to approximately 20 nm to approximately 40 nm. The SiO2 and high-density low-k film, however, do not have significant UV blocking capability and it is difficult to prevent hardening of an underlying low-k film by a remaining film from the CMP process. In another embodiment, however, a hardmask layer can be formed using SiC, SiN, and etc. In this case, a hardmask layer can be made to act as a UV blocking film. The hardmask layer in this case has a characteristic equivalent to that of an etch stopper. Additionally, in still another embodiment, both of an etch stopper and a hardmask layer can made to act as a UV blocking film.

EXAMPLES

Examples of the present invention are shown below. The present invention, however, is not limited to these.

Process and Irradiation Conditions

Figure 6A:
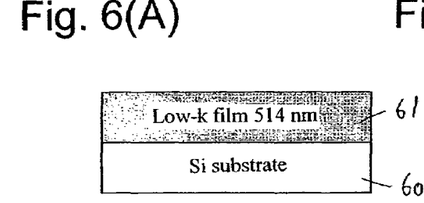
FIGS. 6A to 6E are schematic views showing low-k film curing steps in one embodiment of the present invention. These figures are excessively simplified for purposes of illustrating the invention; and the present invention is not limited to these figures.
Figure 6B:
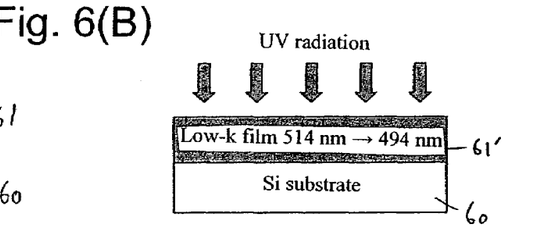

First, using an apparatus shown in FIG. 1, a low-k film 61 was formed with a thickness of approximately 500 nm on a silicon substrate 61 (300 mm in diameter) using 1,3-dimethoxy-tetramethyldisiloxane (DMOTMDS) as a source gas (FIG. 6A). Additionally, film formation conditions were as follows: 200 scm of DMOTMDS, 100 sccm of O2, 200 sccm of He, RF power of 27.12 MHz at 2.5 W/cm2, a substrate temperature of 360° C. and a pressure of 665 Pa. Next, using the apparatus shown in FIG. 3, UV light was irradiated to the substrate under the conditions described below to reform the low-k film 61 and a reformed low-k film 61' was obtained (FIG. 6B).

Processing time: 60 sec.
UV wavelength: 172 nm
Irradiation intensity: 10 mW/cm2
N2: 4,000 sccm
Pressure: 50 Torr
Heater temperature: 430° C.

Figure 6C:
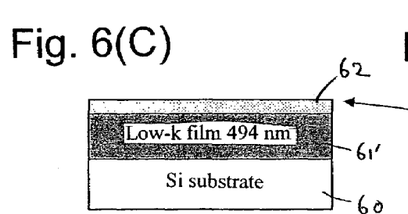

Using an apparatus shown in FIG. 2, a SiC film 62 was formed with a thickness of approximately 50 nm on the reformed low-k film 61' (FIG. 6C). Film formation conditions for the SiC film 62 were as follows: 700 scm of Tetramethylsilane (TMS), 100 sccm of O2, 3,150 sccm of He, RF power of 27.12 MHz at 650 W, RF power of 400 kHz at 180 W, a substrate temperature of 360° C. and a pressure of 665 Pa. Additionally, in the apparatus shown in FIG. 1 and the apparatus shown in FIG. 2, portions common to the two apparatuses are identical.

Figure 6D:
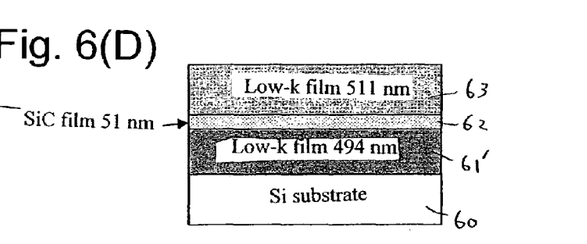

Subsequently, a low-k film 63 was formed with a thickness of approximately 500 nm on the SiC film 62 using DMOTMDS as a source gas (FIG. 6D). Film formation conditions were the same as those applied to the first layer of low-k film.

Figure 6E:
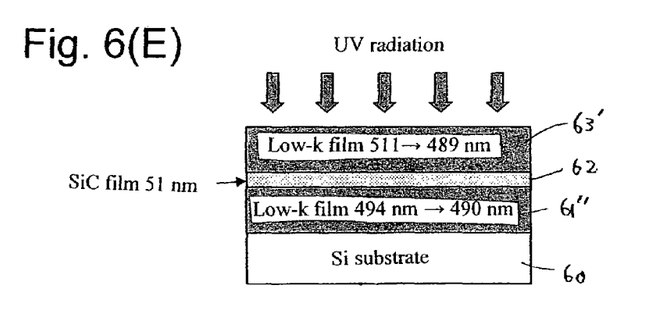

Using the same apparatus used in the first UV irradiation and under the UV conditions described below, the substrate was irradiated with UV light to reform the low-k film 63, and a reformed low-k film 63' was obtained (FIG. 6E). Additionally, at this time, if the first layer of reformed low-k film 61' receives UV irradiation, the reformed low-k film 61' is further reformed and becomes a re-reformed low-k film 61".

Processing time: 60 sec.

Irradiation intensity: 10 mW/cm2
N2: 4,000 sccm
Pressure: 50 Torr
Heater temperature: 430° C.
Irradiation Result As a result of the first irradiation, the first layer of low-k film 61 shrank by 3.9%. As a result of the second irradiation after the SiC film 62, an etch stopper, was formed on the low-k film and the second layer of low-k film 63 was formed further on it, the second layer of low-k film shrank by 4.3%; the first layer of low-k film 61', however, shrank by 0.8% and it was confirmed that the SiC film 62 acted as a UV blocking film.

Figure 7:
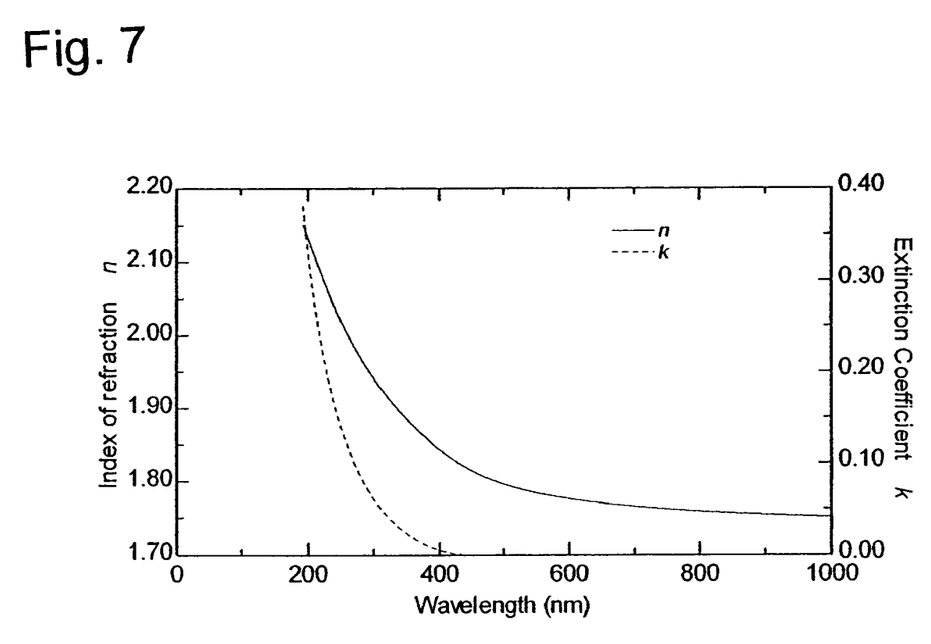
FIG. 7 is a graph showing optical characteristics of a SiC film used in the example described later.

FIG. 7 is a graph of the Reflex Index and Extinction Coefficients (k) of the SiC used in this example. UV wavelengths used in this example were around 172 nm, and because an extinction coefficient (k) of the SiC was near 1 at 200 nm or less, it is considered that UV light was absorbed by the SiC film.

First layer of low-k film: Initial film thickness: 514 nm

After first UV irradiation: 494 nm (Rate of change=20 nm; −3.9%)

After second UV irradiation: 490 nm (Rate of change=4 nm; −0.8%)

Second layer of low-k film: Initial film thickness: 511 nm

After second UV irradiation: 489 nm (Rate of change=22 nm; −4.3%)

Additionally, UV light blocking by a UV blocking film can be grasped as a UV light transmission factor or absorptivity (%); in general, as light absorption can be expressed by $I = I_0 \exp(-4\pi k d/\lambda)$ ($\lambda$: UV Light Wavelength (nm), k: Extinction Coefficient, d: Film Thickness (nm)), Absorptivity A (%) is obtained as follows: $A = 100 - I/I_0 \times 100$. A table below shows absorptivity A (%) at a wavelength of 193 nm. As shown in this table, because absorptivity A can be obtained from a film thickness d and an extinction coefficient k, in order to sufficiently block UV light used, desired absorptivity can be set accordingly by adjusting a film thickness d and a dielectric constant k. Additionally, it is possible to control a dielectric constant k by film formation process conditions.

| $I = I_0 \exp(-4\pi k d/\lambda)$ | | | | | |
|---|---|---|---|---|---|
| $\lambda$ (nm) 193 | | | | | |
| K | 0.1 | 0.2 | 0.5 | 1 | 2 |
| d (nm) | A (%) | A (%) | A (%) | A (%) | A (%) |
| 1 | 0.65 | 1.29 | 3.20 | 6.30 | 12.21 |
| 5 | 3.20 | 6.30 | 15.02 | 27.79 | 47.85 |
| 10 | 6.30 | 12.21 | 27.79 | 47.85 | 72.81 |
| 15 | 9.30 | 17.74 | 38.63 | 62.34 | 85.82 |
| 20 | 12.21 | 22.93 | 47.85 | 72.81 | 92.61 |
| 25 | 15.02 | 27.79 | 55.69 | 80.36 | 96.14 |
| 30 | 17.74 | 32.34 | 62.34 | 85.82 | 97.99 |
| 35 | 20.38 | 36.60 | 68.00 | 89.76 | 98.95 |
| 40 | 22.93 | 40.60 | 72.81 | 92.61 | 99.45 |
| 45 | 25.40 | 44.34 | 76.89 | 94.66 | 99.71 |
| 50 | 27.79 | 47.85 | 80.36 | 96.14 | 99.85 |
| 60 | 32.34 | 54.22 | 85.82 | 97.99 | 99.96 |
| 70 | 36.60 | 59.81 | 89.76 | 98.95 | 99.99 |
| 80 | 40.60 | 64.72 | 92.61 | 99.45 | 100.00 |
| 90 | 44.34 | 69.03 | 94.66 | 99.71 | 100.00 |
| 100 | 47.85 | 72.81 | 96.14 | 99.85 | 100.00 |
| 110 | 51.14 | 76.13 | 97.22 | 99.92 | 100.00 |
| 120 | 54.22 | 79.04 | 97.99 | 99.96 | 100.00 |
| 130 | 57.11 | 81.60 | 98.55 | 99.98 | 100.00 |
| 140 | 59.81 | 83.85 | 98.95 | 99.99 | 100.00 |
| 150 | 62.34 | 85.82 | 99.24 | 99.99 | 100.00 |
| 160 | 64.72 | 87.55 | 99.45 | 100.00 | 100.00 |
| 170 | 66.94 | 89.07 | 99.61 | 100.00 | 100.00 |
| 180 | 69.03 | 90.41 | 99.71 | 100.00 | 100.00 |
| 190 | 70.98 | 91.58 | 99.79 | 100.00 | 100.00 |
| 200 | 72.81 | 92.61 | 99.85 | 100.00 | 100.00 |

INDUSTRIAL APPLICABILITY

According to one embodiment or two or more embodiments of the present invention, an elastic modulus of a film can be improved and this improvement can be made selectively to a target film, thereby facilitating more highly-integrated nanofabrication of the next-generation semiconductor devices and making it possible to provide highly reliable semiconductors.

What is claimed is:

1. A method of forming a multilayer interconnection structure, which comprises:
   (i) forming a low dielectric constant film on a substrate;
   (ii) irradiating the low dielectric constant film with UV light, thereby curing the low dielectric constant film;
   (iii) after step (ii), laminating a UV blocking film on the cured low dielectric constant film, said UV blocking film having an extinction coefficient effective to inhibit shrinkage of the cured low dielectric constant film when being exposed to subsequent UV irradiation;
   (iv) laminating a next low dielectric constant film on the UV blocking film; and
   (v) irradiating the next low dielectric constant film with UV light, thereby curing the next low dielectric constant film while inhibiting shrinkage of the cured low dielectric constant film formed in step (ii) due to the UV blocking film.

2. The method according to claim 1, wherein said UV blocking film has an extinction coefficient of approximately 0.2 or more at a wavelength of UV light irradiated.

3. The method according to claim 1, wherein said UV blocking film is formed with a thickness enough to absorb approximately 50% or more of UV light irradiated.

4. The method according to claim 3, wherein a thickness of said UV blocking film is from approximately 10 nm to approximately 100 nm.

5. The method according to claim 2, wherein said UV blocking film is formed using a material selected from a group consisting of SiC, SiCN, SiCO, and SiN.

6. The method according to claim 1, wherein a wavelength of said UV light is approximately 200 nm or less.

7. The method according to claim 1, which further comprises a step of etching the next low dielectric constant film and the UV blocking film after curing said next low dielectric constant film by irradiating it with UV light.

8. The method according to claim 1, wherein said UV blocking film is used as an etch stopper film.

9. The method according to claim 1, wherein curing of said low dielectric constant film and said next low dielectric constant film is performed with a UV light wavelength of approximately 100 nm to approximately 400 nm, irradiation intensity of approximately 1 mW/cm2 to approximately 1,000 mW/cm2 and irradiation time of approximately 5 sec. to approximately 300 sec.

10. The method according to claim 1, wherein curing of said low dielectric constant film and said next low dielectric constant film is performed at a substrate temperature of approximately 50° C. to approximately 600° C.

11. The method according to claim 1, wherein said curing of said low dielectric constant film and said next low dielectric constant film is performed in an atmosphere of Ar, He, CO2 or N2.

12. The method according to claim 1, wherein on the substrate on which said low dielectric constant film is formed, a wiring layer and a passivation protective film have been formed.

13. The method according to claim 1, wherein said UV blocking film is laminated after said low dielectric constant film is cured, a hardmask layer is formed, patterning is performed, etching is performed, a via or a via/trench is formed, and a CMP process is performed.

14. A method of forming a multilayer interconnection structure, which comprises:
   (i) selecting UV light for curing a low dielectric constant film;
   (ii) selecting a material which absorbs a wavelength of the UV light, said material having an extinction coefficient effective to block UV light for inhibiting shrinkage of the cure low dielectric constant film when being exposed to UV irradiation;
   (iii) forming the low dielectric constant film on a substrate;
   (iv) irradiating the low dielectric constant film with the selected UV light, thereby curing the low dielectric constant film;
   (v) after step (iv), laminating a UV blocking film using the selected material which absorbs a wavelength of the UV light, on the cured low dielectric constant film;
   (vi) laminating a next low dielectric constant film on the UV blocking film; and
   (vii) irradiating the next low dielectric constant film with the UV light, thereby curing the next low dielectric constant film while inhibiting shrinkage of the cured low dielectric constant film formed in step (iv) due to the UV blocking film.

15. The method according to claim 14, wherein in said step of selecting a material which absorbs a wavelength of said UV light, an extinction coefficient at a wavelength used and etching selectivity to a low-k film are used as indicators.

16. The method according to claim 15, wherein said extinction coefficient is 0.2 or more at a wavelength of approximately 200 nm and etching selectivity to a low-k film is 5:1 to 20:1, which are used as indicators.

17. The method according to claim 14, wherein in said step of selecting a material which absorbs a wavelength of said UV light, an IV characteristic of 1E-8A/cm2 or less at 1 MV/cm is further used as an indicator.

18. A method of forming a multilayer interconnection structure, which comprises the steps of:
   forming a first low dielectric constant film having a first film thickness on a substrate;
   irradiating the low dielectric constant film with UV light, thereby curing it to change it to a hardened first low dielectric constant film having a second film thickness;
   laminating a UV blocking film;
   laminating a second low dielectric constant film having a first film thickness; and
   irradiating the second low dielectric constant film with UV light, thereby curing it to change it to a hardened second low dielectric constant film having a second film thickness and simultaneously curing the hardened first low dielectric constant to change its thickness to a third film thickness, wherein a rate of change from the second film thickness of the first low dielectric constant film to the third film thickness is approximately 30% or less of a rate of change from the first film thickness to the second film thickness.

19. The method according to claim 18, wherein said UV blocking film is an etch stopper film.

* * * * *

UNITED STATES PATENT AND TRADEMARK OFFICE
CERTIFICATE OF CORRECTION

PATENT NO. : 7,354,852 B2
APPLICATION NO. : 11/292820
DATED : April 8, 2008
INVENTOR(S) : Matsushita et al.

It is certified that error appears in the above-identified patent and that said Letters Patent is hereby corrected as shown below:

In column 1, line 5, please replace "Non-Divisional" with -- Non-Provisional --

In column 4, line 22-23, please replace "dimethyldimethoxylsilane" with -- dimethyldimethoxysilane --

In column 12, line 66, in Claim 9, please replace "flim" with -- film --

Signed and Sealed this

Seventh Day of October, 2008

JON W. DUDAS
*Director of the United States Patent and Trademark Office*